(12) United States Patent
Kalkanoglu et al.

(10) Patent No.: US 8,404,967 B2
(45) Date of Patent: *Mar. 26, 2013

(54) PHOTOVOLTAIC MODULE

(75) Inventors: Husnu M. Kalkanoglu, Swarthmore, PA (US); Gregory F. Jacobs, Oreland, PA (US); Ming Liang Shiao, Collegeville, PA (US)

(73) Assignee: CertainTeed Corporation, Valley Forge, PA (US)

( * ) Notice: Subject to any disclaimer, the term of this patent is extended or adjusted under 35 U.S.C. 154(b) by 144 days.

This patent is subject to a terminal disclaimer.

(21) Appl. No.: 12/811,493

(22) PCT Filed: Jan. 7, 2009

(86) PCT No.: PCT/US2009/030253
§ 371 (c)(1),
(2), (4) Date: Jul. 10, 2010

(87) PCT Pub. No.: WO2009/089236
PCT Pub. Date: Jul. 16, 2009

(65) Prior Publication Data
US 2010/0282318 A1    Nov. 11, 2010

Related U.S. Application Data

(60) Provisional application No. 61/019,740, filed on Jan. 8, 2008.

(51) Int. Cl.
*H01L 31/042* (2006.01)
(52) U.S. Cl. ........................... 136/251; 136/257
(58) Field of Classification Search ........... 136/243–293
See application file for complete search history.

(56) References Cited

U.S. PATENT DOCUMENTS

| | | |
|---|---|---|
| 3,906,221 A | 9/1975 | Mercier |
| 4,040,867 A | 8/1977 | Forestieri et al. |
| 4,390,595 A | 6/1983 | Yamagishi |
| 4,574,160 A | 3/1986 | Cull et al. |
| 4,663,495 A | 5/1987 | Berman et al. |
| 4,692,557 A | 9/1987 | Samuelson et al. |
| 4,860,509 A | 8/1989 | Laaly et al. |
| 4,924,301 A | 5/1990 | Surbrook |
| 5,164,020 A | 11/1992 | Wagner et al. |
| 5,232,518 A | 8/1993 | Nath et al. |
| 5,271,201 A | 12/1993 | Noone et al. |
| 5,287,669 A | 2/1994 | Hannah et al. |
| 5,375,491 A | 12/1994 | Hannah et al. |
| 5,400,558 A | 3/1995 | Hannah et al. |
| 5,419,941 A | 5/1995 | Noone et al. |
| 5,421,134 A | 6/1995 | Hannah et al. |
| 5,426,902 A | 6/1995 | Stahl et al. |
| 5,437,735 A | 8/1995 | Younan et al. |

(Continued)

FOREIGN PATENT DOCUMENTS

| | | |
|---|---|---|
| DE | 4421078 | 2/1996 |
| DE | 19739948 | 3/1999 |

(Continued)

OTHER PUBLICATIONS

Abstract of JP 02094575 (1990).

(Continued)

*Primary Examiner* — J. Christopher Ball
(74) *Attorney, Agent, or Firm* — Paul & Paul

(57) ABSTRACT

A photovoltaic module includes an encapsulated photovoltaic element and an infrared transmissive decorative overlay simulating conventional roofing.

15 Claims, 5 Drawing Sheets

U.S. PATENT DOCUMENTS

| | | |
|---|---|---|
| 5,474,620 A | 12/1995 | Nath et al. |
| D366,124 S | 1/1996 | Hannah et al. |
| D366,335 S | 1/1996 | Noone et al. |
| D366,336 S | 1/1996 | Noone et al. |
| 5,501,056 A | 3/1996 | Hannah et al. |
| 5,575,861 A | 11/1996 | Younan et al. |
| 5,575,876 A | 11/1996 | Noone et al. |
| 5,590,495 A | 1/1997 | Bressler et al. |
| 5,650,019 A | 7/1997 | Yamada et al. |
| 5,660,014 A | 8/1997 | Stahl et al. |
| 5,700,332 A | 12/1997 | Brown et al. |
| 5,725,006 A | 3/1998 | Kawama et al. |
| 5,807,440 A | 9/1998 | Kubota et al. |
| 5,830,779 A | 11/1998 | Bressler et al. |
| 5,877,874 A | 3/1999 | Rosenberg |
| 5,951,809 A | 9/1999 | Jenkins et al. |
| 6,049,035 A | 4/2000 | Tsuri et al. |
| 6,184,057 B1 | 2/2001 | Van Andel et al. |
| 6,245,987 B1 | 6/2001 | Shiomi et al. |
| 6,268,558 B1 | 7/2001 | Kubota |
| 6,274,860 B1 | 8/2001 | Rosenberg |
| 6,311,436 B1 | 11/2001 | Mimura et al. |
| 6,331,671 B1 | 12/2001 | Makita et al. |
| 6,331,673 B1 | 12/2001 | Kataoya et al. |
| 6,506,970 B2 | 1/2003 | Yamawaki |
| 6,613,598 B1 | 9/2003 | Middelman et al. |
| 6,762,508 B1 | 7/2004 | Kiso et al. |
| 6,914,182 B2 | 7/2005 | Takeda et al. |
| 6,928,775 B2 | 8/2005 | Banister |
| 6,983,571 B2 | 1/2006 | Felton |
| 7,227,078 B2 | 6/2007 | Jongerden et al. |
| 7,387,537 B1 | 6/2008 | Daily et al. |
| 7,445,508 B2 | 11/2008 | Daily et al. |
| 7,572,396 B2 | 8/2009 | Gaudiana et al. |
| 7,681,363 B2 | 3/2010 | Banister |
| 2001/0050102 A1 | 12/2001 | Matsumi et al. |
| 2003/0121228 A1 | 7/2003 | Stoehr et al. |
| 2003/0154973 A1 | 8/2003 | Nyhart, Jr. et al. |
| 2004/0247876 A1 | 12/2004 | LaFave et al. |
| 2004/0253419 A1 | 12/2004 | Bleikolm et al. |
| 2005/0100690 A1 | 5/2005 | Mayer et al. |
| 2005/0102947 A1 | 5/2005 | McCaskill et al. |
| 2005/0144870 A1 | 7/2005 | Dinwoodie |
| 2005/0178428 A1 | 8/2005 | Laaly et al. |
| 2005/0178429 A1 | 8/2005 | McCaskill et al. |
| 2005/0178430 A1 | 8/2005 | McCaskill et al. |
| 2005/0263179 A1 | 12/2005 | Gaudiana et al. |
| 2005/0268962 A1 | 12/2005 | Gaudiana et al. |
| 2006/0000178 A1 | 1/2006 | Almy |
| 2006/0029815 A1 | 2/2006 | Woodruff et al. |
| 2006/0032527 A1 | 2/2006 | Stevens et al. |
| 2006/0042683 A1 | 3/2006 | Gangemi |
| 2006/0048812 A1 | 3/2006 | Tomita |
| 2006/0052558 A1 * | 3/2006 | Morikawa et al. ............ 526/247 |
| 2006/0243318 A1 | 11/2006 | Feldmeier et al. |
| 2007/0251571 A1 | 11/2007 | Jacobs et al. |
| 2008/0178928 A1 | 7/2008 | Warfield et al. |
| 2008/0271773 A1 | 11/2008 | Jacobs et al. |
| 2008/0271774 A1 | 11/2008 | Kalkanoglu et al. |
| 2009/0000221 A1 | 1/2009 | Jacobs et al. |
| 2009/0014051 A1 | 1/2009 | Gumm |
| 2009/0046684 A1 | 2/2009 | Yamamoto |
| 2009/0133340 A1 | 5/2009 | Shiao et al. |
| 2009/0133738 A1 | 5/2009 | Shiao et al. |
| 2009/0133739 A1 | 5/2009 | Shiao et al. |
| 2009/0133740 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0194143 A1 | 8/2009 | Jacobs et al. |
| 2009/0205270 A1 | 8/2009 | Shaw et al. |
| 2009/0242015 A1 | 10/2009 | Wattman et al. |

FOREIGN PATENT DOCUMENTS

| | | |
|---|---|---|
| DE | 20214872 | 2/2003 |
| FR | 2896596 | 1/2006 |
| FR | 2890181 | 9/2007 |
| JP | 2001332752 | 11/2001 |
| JP | 06045628 A | 2/2006 |
| JP | 08-139347 A | 6/2008 |
| WO | 2007035677 | 3/2007 |
| WO | 2007085721 A1 | 8/2007 |

OTHER PUBLICATIONS

Abstract of JP 08312089 (1996).
Abstract of JP 2001/188411 (2000).
Abstract of JP 10093125 (1998).
Abstract of JP 63299171 (1988).
Abstract of JP 63213978 (1988).
D. L. King, et al., Field Experience with a New Performance Characterization Procedure for Photovoltaic Arrays, Sandia National Laboratories, 2nd World Conference and Exhibition on Photovoltaic Solar Energy Conversion, Jul. 6-10, 1998, Vienna, Austria.
D. Aiken, et al., Temperature Dependent Spectral Response Measurements for III-IV Multi-Junction Solar Cells, "Whitepaper," Emcore Photovoltaics, Nov. 19, 2003.
N.J.C.M. Van Der Borg, et al., Building Intergration of Photovoltaic Power Systems Using Amorphous Silicon Modules: Irradiation Loss Due to Non-Conventional Orientations, ECN-C-01-068, Dec. 2001.
J. J. Klaassen, et al. AIGaN Photodiodes Respond to Ultraviolet C. DRC9925, NASA Tech Briefs, Feb. 2000.
S. Silvestre, et al., A Fast-Low-Cost Solar Cell Spectral Response Measurement System with Accuracy Indicator, IEEE Transactions on Instrumentation and Measurement, 48(5), pp. 944-948, Oct. 1999.
W.G.J.H.M. Vansark, et al., Modeling Improvement of Spectral Response of Solar Cells by Deployment os Spectral Converters Containing Semiconductor Nanocrystals, Semiconductors, 38(8), pp. 962-969 (2004).
N. H. Reich, et al., Weak light performance and spectral response of different solar cell types in: Proceedings of the 20th European Photovoltaic Solar Energy Conference, (Eds. W. Palz, H. Ossenbrink, PH. Helm), WIP-Renewable Energies, pp. 2120-2123 Munich, Germany 2005.
Solar Electric Roof Tile: C21e, Solarcentury www.solarcentury.com, 2006.
H. Field, Solar Cell Spectral Response Measurement Errors Related to Spectral Band Width and Chopped Light Form 26th IEEE Photovoltaic Specialists Conference, Sep. 29 to Oct. 3 Anaheim, CA 1997.
H. Hunter Fanney, Short-Term Characterization of Building Integrated Photovoltaic Panels, Proceedings of Folar Forum 2002; Sunrise on the Reliable Energy Economy, Jun. 15-19, 2002, Reno, NV.

* cited by examiner

PHOTOVOLTAIC MODULE

Cross-Reference to Related Application

This is a national stage 371 application of International Application No. PCT/US2009/030253, filed Jan. 7, 2009, and claims the benefit of Provisional Patent Application No. 61/019740, filed Jan. 8, 2008.

BACKGROUND OF THE INVENTION

1. Field of the Invention

The present invention relates to photovoltaic modules, and in particular to photovoltaic modules adapted for installation on roofs.

2. Brief Description of the Prior Art

The use of photovoltaic ("PV") modules on roofs is becoming increasingly common. Often perched on tile or shingle-covered roofs, these solar energy-generating arrays are quite visible, and generally not quite aesthetically pleasant to the eye, somewhat comparable to the TV antennas of the past. To date the installations appear to have been motivated by purely practical, functional considerations; there generally appears to be little to no color and design coordination between the PV modules and the roofing tiles or shingles on which the modules are mounted.

PV modules usually feature a black to purple or blue surface protected by a thin transparent glass or plastic cover. These colors frequently do not work well aesthetically with the rest of the roof.

Photovoltaic materials require incident light to produce energy via the photoelectric effect. Such materials typically have a wavelength dependency in their response to incident light. That is to say that some parts of the spectrum may be used by a PV module more effectively than others in producing electricity. Intuitively, to cover or color the PV module with an opaque material to obtain a desirable aesthetic appearance would cause a blocking of the incident light and the photovoltaic material would no longer be active. To color the top surface with a clear coating, film or membrane may change the color, but may not easily yield a desirable effect for a roofing product. Also, a visually transparent film may still block parts of the spectrum important for power generation.

A variety of approaches have been taken for using the substantial area provided by roofs to collect solar energy. One approach has been to cover existing roofs using systems employing panels, tiles or shingles including solar cells. Panel-type systems are disclosed, for example, in U.S. Pat. Nos. 5,232,518 and 6,245,987.

Various attempts have been made to blend photovoltaic cells with traditional roofing systems. For example, U.S. Pat. Nos. 5,437,735 and 5,575,861, each incorporated herein by reference, disclose a photovoltaic shingle system including a strip of roofing material having an overlap portion, and tabs extending from the overlap portion. Each of the tabs includes a photovoltaic device. U.S. Pat. No. 6,875,914 discloses a photovoltaic roofing system including photovoltaic power-generating roofing shingles provided with linearly aligned electrical terminal. A protective cap shields the electrical connections. U.S. Pat. No. 6,883,290 discloses a shingle system including photovoltaic modules secured to a base to create a shingle assembly with a venting region between the module and the base for temperature regulation. U.S. Pat. No. 6,928,775 discloses a multi-use electric tile module for walling, flooring or roofing applications that can include a photovoltaic module. U.S. Patent Application Publication No. 2006/0000178 discloses a shingle assembly with a support bracket specifically adapted for the installation of photovoltaic shingles.

U.S. Pat. No. 4,574,160 discloses a flexible, rollable photovoltaic cell module. U.S. Pat. No. 4,860,509 discloses photovoltaic cells in combination with single ply roofing membranes.

U.S. Patent Application Publication No. 2005/0102947 discloses photovoltaic building materials having a regular shape, such as rectangular or trapezoidal, and carrying solar cells formed from thin film materials, conventional crystal/silica, or photoelectric silica spheres. The materials are specially adapted for installation along the ridgeline of a roof. U.S. Patent Application Publication No. 2005/0144870 discloses a shingle system incorporating a photovoltaic module and a base to define a venting region, and may include a waterproofing element.

U.S. Patent Application Publication No. 2005/0178429 discloses a flexible integrated photovoltaic roofing membrane shingles having a "dragon's tooth" shape with solar elements that connect electrically with previous and successive shingle courses. U.S. Patent Application Publication No. 2005/0263179 discloses a photovoltaic module architecture which includes electrical interconnects that provide for connecting the anode of one module with the cathode of another module.

U.S. Patent Application Publication No. 2005/0268962 discloses flexible photovoltaic cells and related systems. U.S. Pat. No. 6,729,081, incorporated herein by reference, discloses a self-adhesive photovoltaic module. U.S. Patent Application Publication No. 2006/0032527 discloses a solar panel overlay and assembly for mounting on an underlying roof deck, designed to mimic the appearance of the underlying shingled roof deck.

U.S. Patent Application Publication No. 2003/0121228 discloses a dendritic web solar cell shingling system providing much thinner photovoltaic arrays than conventional cells.

U.S. Pat. No. 6,730,841 discloses a method and apparatus for mounting a flexible photovoltaic roofing material.

U.S. Patent Application Publication No. 2006/0042683 discloses a system for mounting photovoltaic cells on a surface and for using the electrical energy produced. The cell can be pigmented to assure efficient collection of available radiation, for example, by using a pink-colored glass.

U.S. Patent Application Publication No. 2005/0048821 discloses a dye-sensitized solar cell having a high conversion efficiency.

U.S. Patent Application Publication No. 2003/0154973 discloses a radiation collector configured to collect incident radiation. The collectors can be colored to give the appearance of traditional shingles or other roofing or building material such that the roof appears aesthetically the same as a traditional roof.

U.S. Pat. No. 5,650,019 discloses a solar cell module having a three-layer structure including a thin film solar cell, a hard resin layer such as polycarbonate to mechanically protect the solar cell, an ultraviolet radiation absorbing adhesive layer to protect the hard resin layer, such as ethylene vinyl acetate including an ultraviolet absorber such as a suitable benzophenone or triazole, and an outermost layer having excellent weatherability, such as a fluororesin.

U.S. Pat. No. 6,331,673 discloses an amorphous silicon solar cell module in which the solar cell is encapsulated in a transparent organic polymer, namely an acrylic resin and covered with a thin film of a suitable fluoropolymer resin, reinforced with glass fibers.

There is a continuing need for photovoltaic modules having more controllable and desirable aesthetics for use in roof applications while still maintaining sufficient efficiency in power generation.

SUMMARY OF THE INVENTION

The present invention provides a photovoltaic module comprising a photovoltaic element having an upper surface, an encapsulant resin layer over the upper surface of the photovoltaic element, a decorative overlay positioned above the upper surface of the photovoltaic element, and an optional cover plate. The decorative overlay is preferably substantially transmissive of both near infrared radiation and infrared radiation.

Preferably, the decorative overlay is selected so that the operation of the photovoltaic element is not substantially inhibited. Preferably, the electrical power output from the photovoltaic element is not substantially reduced by the presence of the decorative overlay.

In one presently preferred embodiment of the present invention, the decorative overlay is positioned outside the optional cover plate. In another embodiment of the present invention, the decorative overlay is positioned under the optional cover plate. In a further embodiment of the present invention, the decorative overlay is embedded in the encapsulant resin layer. In yet another embodiment of the present invention, the decorative overlay is positioned on top of the encapsulant resin layer.

Preferably, in one aspect the present invention provides a photovoltaic module wherein the decorative overlay simulates the appearance of a conventional roofing shingle surface. In another aspect, the present invention provides a photovoltaic module wherein the decorative overlay simulates the appearance of a clay ceramic or cementitious roofing tile. In yet another aspect, the present invention provides a photovoltaic module wherein the decorative overlay simulates the appearance of a polymeric roofing or siding panel.

The decorative overlay can be provided in a number of different ways. For example, in one aspect, the decorative overlay comprises a coating layer or ink including a binder and at least one infrared-transmissive pigment. The coating layer or ink can be applied directly to the optional cover plate of the photovoltaic module, directly on the encapsulant resin layer, or on an infrared-transmissive film. Preferably, the at least one infrared-transmissive pigment is selected from the group consisting of nanoparticle titanium dioxide, zinc sulfide, zinc oxide, CI Pigment Black 31, CI Pigment Black 32, CI Pigment Red 122, and CI Pigment Yellow 13. Thus, the decorative overlay can comprise a film material. In one aspect, the film material includes a carrier and at least one infrared-transmissive pigment. In another aspect, the film material includes a decorative layer formed on the surface of the film. When the decorative layer is printed on the film material, the encapsulant resin layer, or the optional cover plate, the decorative layer is preferably formed by a halftone printing process.

The present invention also provides a process for producing a decorative photovoltaic module. In one embodiment, the process includes providing a photovoltaic module including a semiconductor stack encapsulated in an infrared transmissive resin to form an encapsulant resin layer and optionally covered with a top plate, and adhering an overlay film bearing a decorative pattern to the encapsulant resin layer or optional top plate using an infrared transmissive adhesive material. In another embodiment, the process of the present invention comprises providing a photovoltaic module including a semiconductor stack encapsulated in an infrared-transmissive resin to form an encapsulant resin layer and covered with an optional top plate, and printing a decorative pattern on the encapsulant resin layer or optional top plate using an infrared-transmissive ink. In a further embodiment of the process of the present invention, the process comprises providing a photovoltaic module including a semiconductor stack encapsulated in a layer of an infrared transmissive resin to form an encapsulant resin layer, adhering an overlay film bearing a decorative pattern to the layer of infrared transmissive resin, and optionally adhering a top plate to the overlay film using an infrared transmissive adhesive material.

In another aspect, the present invention provides a photovoltaic module comprising a photovoltaic element having an upper surface, an encapsulant resin layer over the upper surface of the photovoltaic element, and a decorative overlay positioned above the upper surface of the photovoltaic element. In this aspect, the overlay is substantially transmissive of near infrared radiation and infrared radiation. In this aspect, the decorative overlay can be positioned outside the encapsulant resin layer, under the encapsulant resin layer, or the decorative overlay can be embedded in the encapsulant resin layer. Preferably, the decorative overlay simulates the appearance of a conventional roofing shingle surface, a conventional roofing tile or slate, or a conventional metal or polymeric roofing panel or siding panel.

In this aspect, the decorative overlay preferably comprises a coating layer including a binder and at least one infrared-transmissive pigment. Preferably, the at least one infrared-transmissive pigment is selected from the group consisting of zinc sulfide, zinc oxide, nanoparticle titanium dioxide, CI Pigment Black 31, CI Pigment Black 32, CI Pigment Red 122, and CI Pigment Yellow 13. Preferably, the overlay comprises a film material. Preferably, the film material includes a carrier and at least one infrared-transmissive pigment. Preferably, the film material includes a decorative layer on the surface of the film. In one embodiment of the photovoltaic module of the present invention, the decorative layer is preferably formed by a halftone printing process.

In yet another aspect, the present invention provides a process for producing a decorative photovoltaic module comprising providing a photovoltaic module including a semiconductor stack encapsulated in an infrared transmissive resin having an upper resin layer, and adhering an overlay film bearing a decorative pattern to the upper resin layer using an infrared transmissive adhesive material. Preferably, the decorative photovoltaic module is incorporated into a roofing cover.

In another aspect, the present invention provides a process for producing a decorative photovoltaic module comprising providing a photovoltaic module including a semiconductor stack encapsulated in an infrared transmissive resin having an upper resin layer, and printing a decorative pattern on the upper resin layer using an ink selected from the group consisting of opaque inks, infrared transmissive inks and partially transmissive inks. Preferably, the decorative pattern further includes an infrared transmissive ink on at least a first portion of the upper resin layer and an opaque ink on at least a second portion of the upper resin layer. In one aspect of the present process, the decorative photovoltaic module is preferably incorporated into a roofing cover.

DETAILED DESCRIPTION

As used in the present specification and claims:

"Photovoltaic module" means one or more photovoltaic cells electrically connected to operate as an integral unit.

"Infrared radiation" means electromagnetic radiation having a wavelength of from 1.4 micrometers to 1000 micrometers.

"Near infrared radiation" means electromagnetic radiation having a wavelength of from 0.75 micrometers to 1.4 micrometers.

"Visible radiation" means electromagnetic radiation having a wavelength of from 350 to 750 nanometers.

"Substantially transmissive" when referring to radiation means having an average transmission coefficient of at least 50 percent.

"Highly transmissive" when referring to radiation means having an average transmission coefficient of at least 80 percent.

In one aspect, the present invention provides improved photovoltaic modules having surface colors that are aesthetically compatible with other types of roof coverings, such as previously installed shingles, tiles, slate, etc.

Solar radiation has substantial spectral components in the near infrared and infrared ranges. Preferably, the photovoltaic modules of the present invention include a color layer that is formulated to be substantially transmissive or transparent to the infrared portion of the spectrum, thus to permit photovoltaic modules to function while using the visible portion of the spectrum to achieve a desired aesthetic effect.

Conventional solar cells can include several layers, such as an n-type silicon layer doped with an electron donor such as phosphorous, oriented towards incident solar radiation, and a p-type silicon layer doped with an electron acceptor, such as boron, as well as a pair of electrical current conducting layers for interconnection with other cells and/or the environment. The silicon layers can be embedded in a protective layer of encapsulant material, such as ethylene vinyl acetate, and covered with glass. Antireflection coatings can be applied to electron-donor layer and the glass to maximize solar radiation adsorption. The antireflection coating gives the conventional solar cell a characteristic blue or black appearance.

The present invention provides a photovoltaic module having controllable and desirable aesthetics for use in roof applications while still maintaining sufficient efficiency in power generation. The photovoltaic device of the present invention is provided with a coating or overlay layer having a desirable visual appearance in the visible spectrum and substantial transmissivity in the near infrared and infrared regions of the electromagnetic spectrum. Portions of the visible spectrum are selectively absorbed so that the light reflected in the visible range gives a desired color while the near infrared and infrared light, or at least a substantial portion thereof, passes through the coating or overlay to activate the photovoltaic device.

Figure 1:
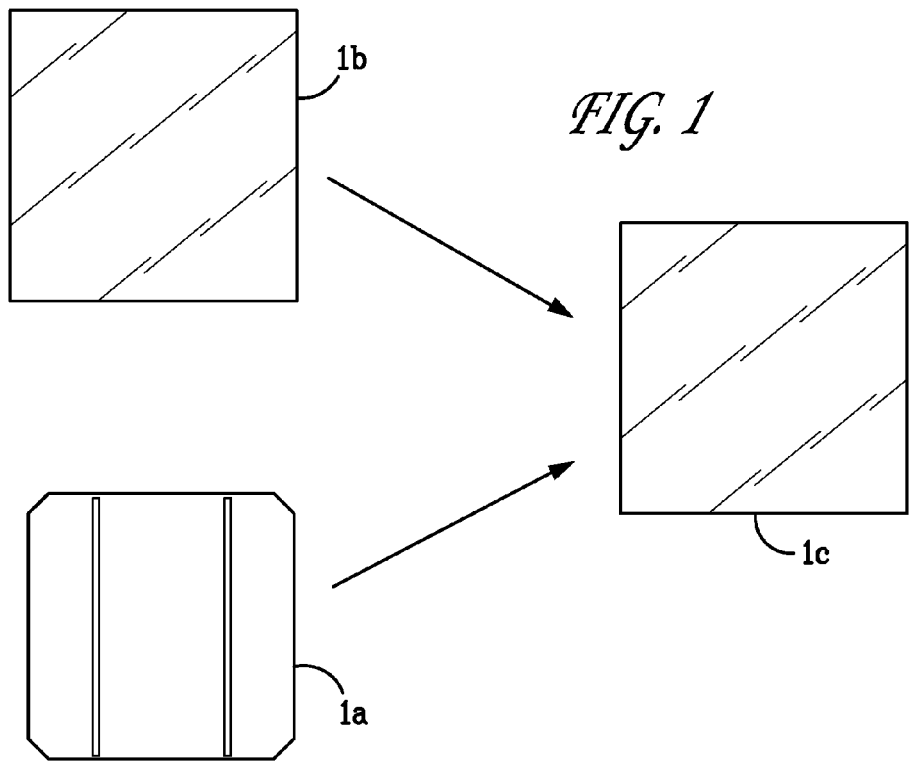
FIG. 1 is schematic plan view showing a process for producing a photovoltaic module according to the present invention and employing an infrared transmissive overlay film and a conventional photovoltaic cell.

Referring now to the figures in which like reference numerals represent like elements in each of the several views, there is shown in FIG. 1 a schematic plan view of a process for producing a modified photovoltaic module 1c according to the present invention and employing an infrared transparent overlay film 1b and a conventional photovoltaic module 1a including a mono-crystalline silicon solar cell covered with a dark blue silicon nitride antireflection film and available from China Electrical Equipment Group, Nanjing, China. In the present process an overlay film 1b is placed over and adhered to the upper surface of a conventional photovoltaic module 1a. The overlay film 1b is transparent or transmissive for radiation in the infrared and near-infrared portions of the spectrum, but includes a visible-light absorbing pigment to provide a monochromatic appearance to the human eye. The film 1b is bonded to the upper surface of the conventional photovoltaic module 1a using an infrared light transmissive adhesive (not shown), such as an ethylene vinyl acetate hot melt adhesive composition having a softening point greater than the anticipated operating temperature range for the modified photovoltaic module 1c.

Alternatively, the overlay film 1b can be placed over the conventional photovoltaic module 1a and secured mechanically (not shown) to provide the modified photovoltaic module 1c.

Figure 2:
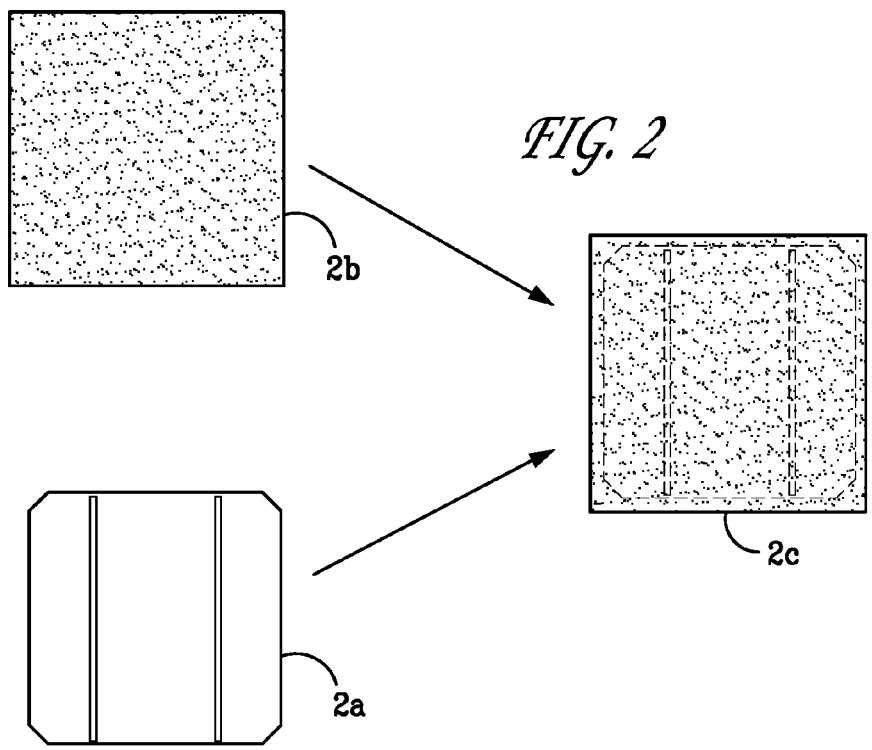
FIG. 2 is a schematic plan view showing the process of FIG. 1, substituting an overlay film having a mottled appearance in the visible range but being substantially transmissive to near infrared and infrared radiation.

FIG. 2 depicts the process of FIG. 1, except that an overlay film 2b having a mottled appearance is substituted for the monochromatic overlay film 1b employed in the process of FIG. 1. The overlay film 2b has a mottled appearance in the visible range but is substantially transparent to near infrared and infrared radiation. Application of the mottled overlay film 2b to a conventional photovoltaic module 2a is provides a modified photovoltaic module 2c having a mottled appearance.

Figure 3:
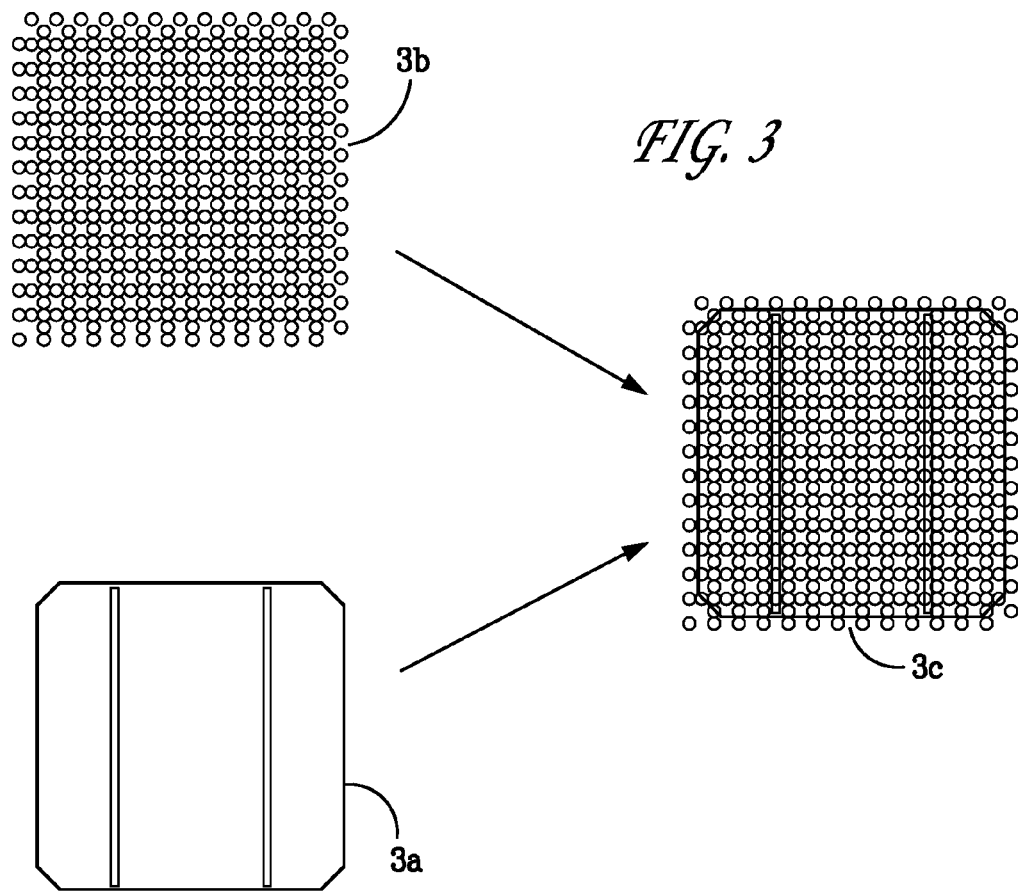
FIG. 3 is a schematic plan view showing a second process for producing a modified photovoltaic module according to the present invention, in which a design is printed on a conventional photovoltaic module using a four-color technique with ink pigmented to be absorb in the visible range, but substantially transmissive to near infrared and infrared radiation, and optionally leaving some areas of the surface without color printed on the module.

FIG. 3 depicts a further embodiment of a process for producing a modified photovoltaic cell according to the present invention. In this embodiment, infrared-transmissive ink or coating material is applied directly to the copper nitride surface of the conventional photovoltaic cell. Four different inks, each having a different appearance in the visible spectrum, but each being infrared and near-infrared transmissive, are applied as a pattern 3b to the upper surface of a conventional photovoltaic module 3a using a suitable technique, such as a lithographic or ink-jet technique, to provide a modified photovoltaic module 3c. The pattern can be a screened stochastic half-tone pattern reproducing a color image, such as an image of a section of a conventional roofing shingle covered with roofing granules colored with conventional metal oxide colorants. For purposes of illustration, the individual color "dots" forming the pattern are depicted as being large enough to be individually distinguishable to the unaided eye. However, a much finer screened pattern can be employed, such as one having a frequency of 30-200 lines per inch, to provide a conventional half-tone image. One, two or more different color inks or coating compositions can optionally be used to form the color "dots." Further, the pattern can exploit the preexisting colors of the other components of the photovoltaic module to achieve a desired aesthetic result.

Figure 4:
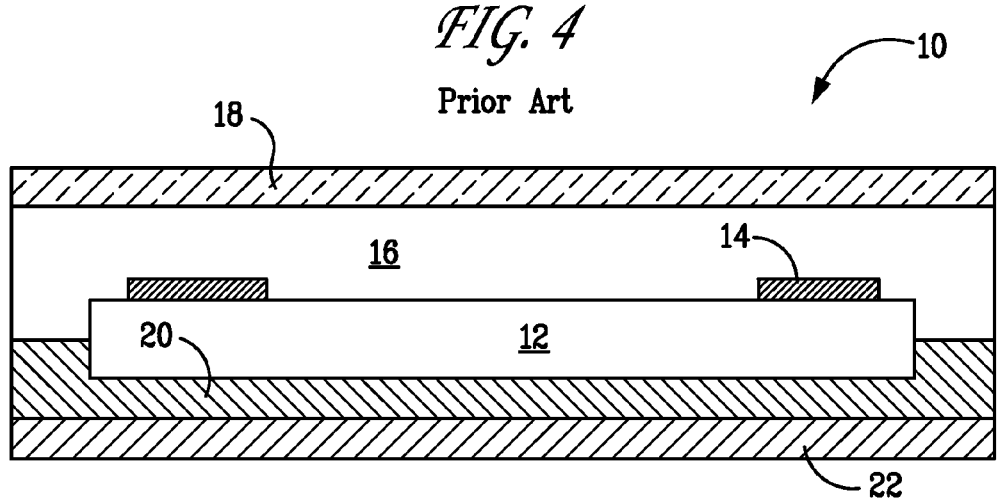
FIG. 4 is a schematic sectional elevational view of a photovoltaic module of the prior art.

A conventional photovoltaic module 10 of the prior art is depicted in the schematic sectional elevational view of FIG. 4. The photovoltaic module 10 includes a solar cell stack 12 formed from a plurality of layers (not shown) including n-type and p-type crystalline, polycrystalline or amorphous silicon layers, transparent electrode layers, and a backing plate, and fitted with external current collecting electrodes 14 for connecting the solar cell stack to permit a photocurrent to flow from the solar cell stack 12 to an external load (not shown). The solar cell stack 12 is encapsulated on its upper surface (the surface intended to face the sun) by an outer layer of upper surface encapsulant resin 16, and on its lower surface by an inner layer 20 of lower surface encapsulant resin. The upper surface encapsulant resin is covered with a cover or top plate 18 transparent or transmissive to infrared and near infrared radiation such as a suitable glass sheet or suitable fluororesin film, and the lower surface encapsulant resin layer 20 is covered by a backing plate 22 formed from a rigid material such as a rigid synthetic polymer composition such as a nylon or polycarbonate or a metal such as aluminum.

Figure 5:
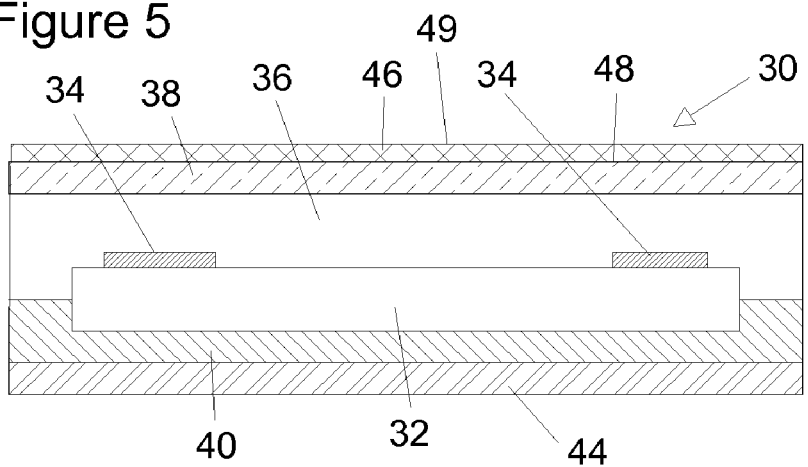
FIG. 5 is a schematic sectional elevational view of a first embodiment of a photovoltaic module of the present invention.

A modified photovoltaic module 30 according to a first embodiment of the present invention is schematically illustrated in the sectional elevational view of FIG. 5. The modified photovoltaic module 30 includes a solar cell stack 32 fitted with external current collecting electrodes 34 for connecting the solar cell stack 32 to an external load. The solar stack 32 is encapsulated on its upper surface by an outer layer of upper surface encapsulant resin 36, and on its lower surface by an inner layer 40 of lower surface encapsulant resin. The upper surface encapsulant resin layer 36 is covered with a top plate 38, and the lower surface encapsulant resin layer 36 is covered by a backing plate 44. The upper surface encapsulant resin layer 36 and the lower surface encapsulant resin layer 40 can be formed from the same resin material, or they can be formed from different resin materials. However, the upper surface encapsulant resin layer 36 is preferably formed from a resin material that is substantially transparent or transmissive to both near infrared radiation and infrared radiation, such as an ethylene vinyl acetate resin. An infrared transmissive overlay film 46 is adhered to the upper or outer surface of the top plate 38 by a thin film 48 of infrared transmissive adhesive material. Optionally, the infrared transmissive overlay film 46 may itself be adherable without the need for an additional thin film adhesive 48 (not shown). The overlay film 46 includes a surface coating 49 including pigment absorbing radiation in the visible range arranged in a decorative pattern, such as illustrated in FIG. 3b. Surface coating 49 can optionally be applied directly to top plate 38 (also not shown).

Figure 6:
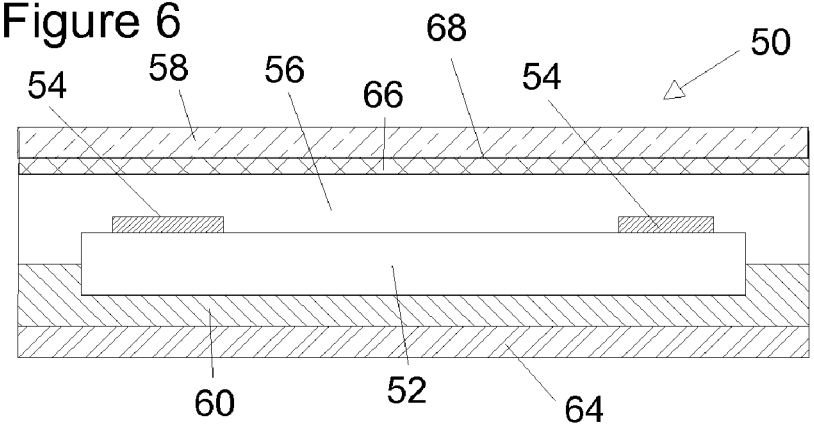
FIG. 6 is a schematic sectional elevational view of a second embodiment of a photovoltaic module of the present invention.

A modified photovoltaic module 50 according to a second embodiment of the present invention is schematically illustrated in the sectional elevational view of FIG. 6. As in the case of the first embodiment of the modified photovoltaic module 30 illustrated in FIG. 5, the modified photovoltaic module 50 of this second embodiment includes a solar cell stack 52 fitted with external current collecting electrodes 54 for connecting the solar cell stack 52 to an external load. Further, the solar stack 52 is encapsulated on its upper surface by an outer layer of upper surface encapsulant resin 56, and on its lower surface by an inner layer 60 of lower surface encapsulant resin. In addition, the lower surface encapsulant resin layer 60 is covered by a backing plate 64. However, in this case, the upper surface encapsulant resin layer 56 is covered with an infrared transmissive overlay film 66, which in turn is covered by a top plate 58. In this case, the infrared transmissive overlay film 66 includes pigment absorbing radiation in the visible range, dispersed in the overlay film 66 to give a mottled appearance to the overlay film 66, such as illustrated in FIG. 1b. The top plate 58 is adhered to the overlay film 66 by a thin film 68 of infrared transmissive adhesive material.

Figure 7:
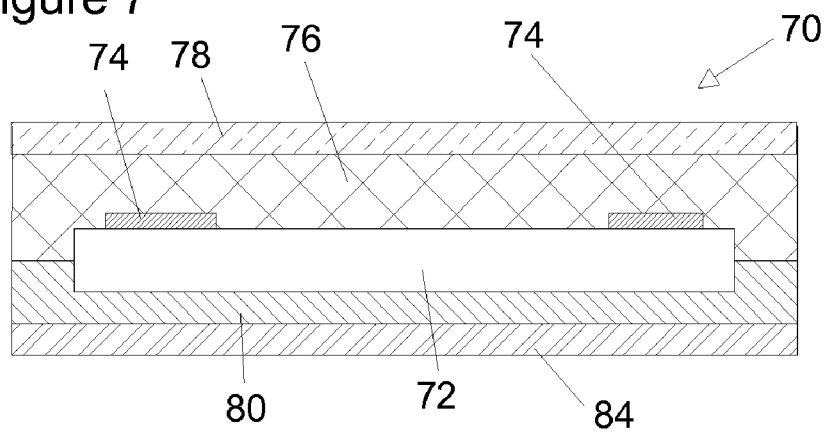
FIG. 7. is a schematic sectional elevational view of a third embodiment of a photovoltaic module of the present invention.

A modified photovoltaic module 70 according to a third embodiment of the present invention is schematically illustrated in the sectional elevational view of FIG. 7. As in the case of the first embodiment of the modified photovoltaic module 30 illustrated in FIG. 5, the modified photovoltaic module 70 of this third embodiment includes a solar cell stack 72 fitted with external current collecting electrodes 74 for connecting the solar cell stack 72 to an external load. Further, the solar stack 72 is encapsulated on its lower surface by an inner layer 80 of lower surface encapsulant resin, and the lower surface encapsulant resin layer 80 is covered by a backing plate 84. However, in this case, the upper surface encapsulant resin layer 76 is formed from an infrared transmissive material including pigment absorbing radiation in the visible range, dispersed randomly in the upper encapsulant resin layer 76 to give a distinctive hue to the encapsulant resin layer 76, the hue being selected to match or complement the hue of a conventional roofing shingle. The upper encapsulent layer 76 is in turn covered by a top plate 78.

Figure 8:
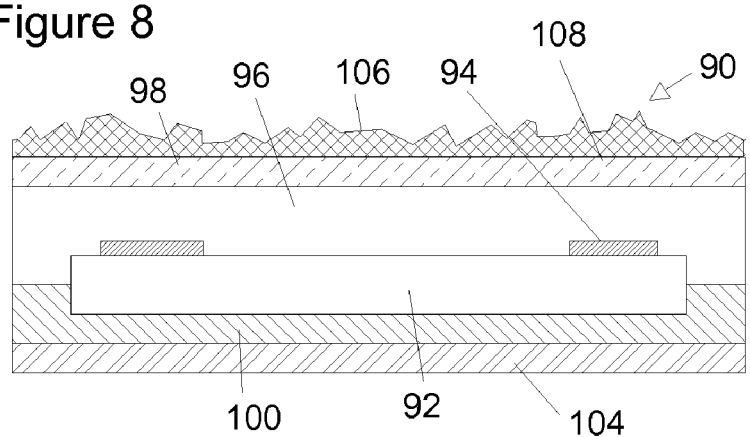
FIG. 8 is a schematic sectional elevational view of a fourth embodiment of a photovoltaic module of the present invention.

A modified photovoltaic module 90 according to a fourth embodiment of the present invention is schematically illustrated in the sectional elevational view of FIG. 8. As in the case of the first embodiment of the modified photovoltaic module 30 illustrated in FIG. 5, the modified photovoltaic module 90 of this fourth embodiment includes a solar cell stack 92 fitted with external current collecting electrodes 94 for connecting the solar cell stack 92 to an external load. Further, the solar stack 92 is encapsulated on its upper surface by an outer layer of upper surface encapsulant resin 96, and on its lower surface by an inner layer 100 of lower surface encapsulant resin. In addition, the upper surface encapsulant resin layer 96 is covered with a top plate 98, and the lower surface encapsulant resin layer 100 is covered by a backing plate 104. An infrared transmissive overlay film 106 is adhered to the upper or outer surface of the top plate 98 by a thin film 108 of infrared transmissive adhesive material. In another embodiment, the adhesive material is omitted, and the overlay film 108 is secured otherwise, such by suitable fasteners or edging material (not shown) to the top plate 98. The upper surface of the overlay film 106 is provided with a three-dimensional pattern simulating the appearance of roofing granules on a conventional roofing shingle. The three-dimensional pattern can be created by embossing, molding, selectively coating, or by any of the many ways known in the art for creating a three-dimensional pattern. In addition, the overlay film 106 includes pigment absorbing radiation in the visible range, providing a hue simulating the hue of a conventional roofing shingle.

Figure 9:
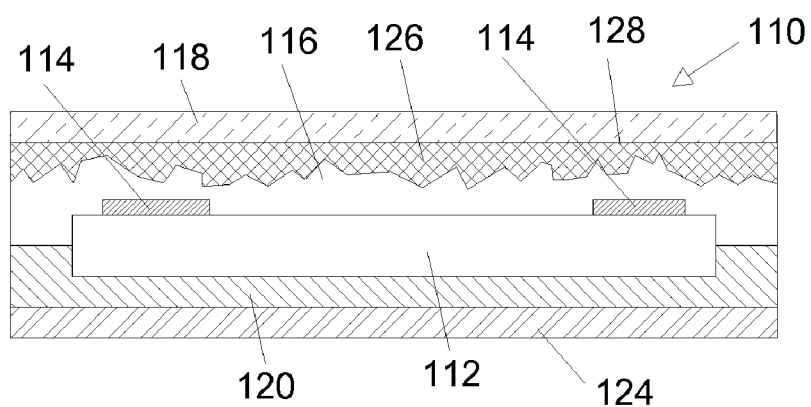
FIG. 9 is a schematic sectional elevational view of a fifth embodiment of a photovoltaic module of the present invention.

A modified photovoltaic module 110 according to a fifth embodiment of the present invention is schematically illustrated in the sectional elevational view of FIG. 9. As in the case of the first embodiment of the modified photovoltaic module 30 illustrated in FIG. 5, the modified photovoltaic module 110 of this fifth embodiment includes a solar cell stack 112 fitted with external current collecting electrodes 114 for connecting the solar cell stack 112 to an external load. The solar stack 112 is encapsulated on its upper surface by an outer layer of upper surface encapsulant resin 116, and on its lower surface by an inner layer 120 of lower surface encapsulant resin. In addition, the lower surface encapsulant resin layer 120 is covered by a backing plate 124. In this embodiment of the present invention, the upper surface encapsulant resin layer 116 is covered with an infrared transmissive overlay film 126. The lower surface of the overlay film 126 is provided with a three-dimensional pattern simulating the appearance of roofing granules on a conventional roofing shingle. In addition, the overlay film 126 includes pigment that absorbs radiation in the visible range, providing a hue simulating the hue of a conventional roofing shingle. The upper surface of the overlay film 126 is covered with a top plate 118, and adhered to the lower surface of the top plate 118 by a thin film 128 of infrared transmissive adhesive material.

Figure 10:
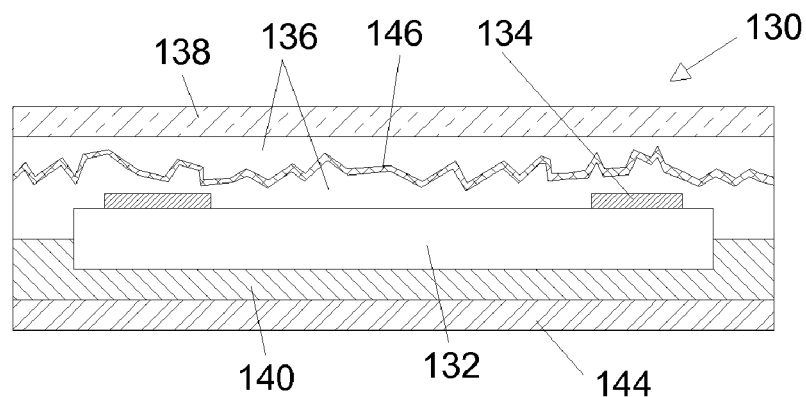
FIG. 10 is a schematic sectional elevational view of a sixth embodiment of a photovoltaic module of the present invention.

A modified photovoltaic module 130 according to a sixth embodiment of the present invention is schematically illustrated in the sectional elevational view of FIG. 10. As in the case of the first embodiment of the modified photovoltaic module 30 illustrated in FIG. 5, the modified photovoltaic module 130 of this sixth embodiment includes a solar cell stack 132 fitted with external current collecting electrodes 134 for connecting the solar cell stack 132 to an external load. Further, the solar stack 132 is encapsulated on its upper surface by an outer layer of upper surface encapsulant resin 136, and on its lower surface by an inner layer 140 of lower surface encapsulant resin. In addition, the upper surface encapsulant resin layer 136 is covered with a top plate 138, and the lower surface encapsulant resin layer 140 is covered by a backing plate 144. In this embodiment of the present invention, an infrared transmissive overlay film 146 is embedded in the upper surface encapsulant resin layer 136. The overlay film 146 is provided with a three-dimensional pattern simulating the appearance of roofing granules on a conventional roofing shingle. In addition, the overlay film 146 includes pigment that absorbs radiation in the visible range, providing a hue simulating the hue of a conventional roofing shingle.

Figure 11:
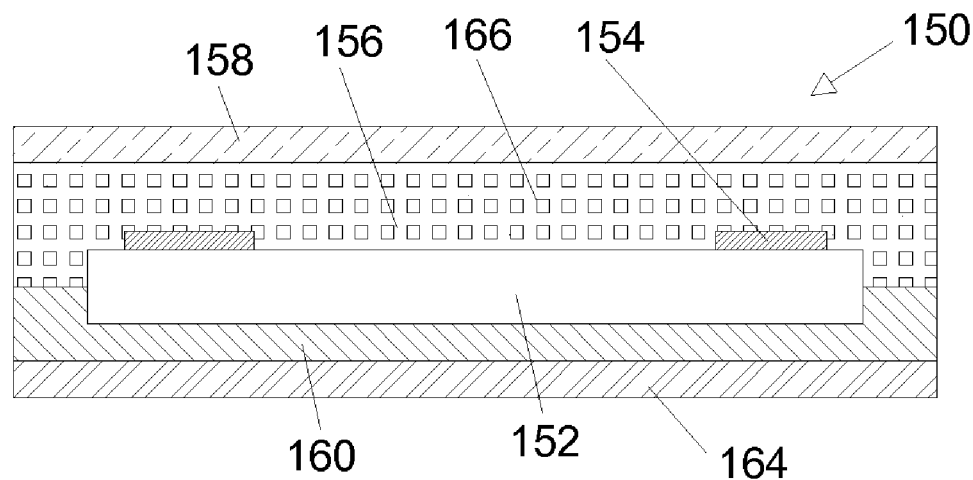
FIG. 11 is a schematic sectional elevational view of a seventh embodiment of a photovoltaic module of the present invention.

A modified photovoltaic module 150 according to a seventh embodiment of the present invention is schematically illustrated in the sectional elevational view of FIG. 11. As in the case of the first embodiment of the modified photovoltaic module 30 illustrated in FIG. 5, the modified photovoltaic module 150 of this seventh embodiment includes a solar cell stack 152 fitted with external current collecting electrodes 154 for connecting the solar cell stack 152 to an external load. Further, the solar stack 152 is encapsulated on its upper surface by an outer layer of upper surface encapsulant resin 156, and on its lower surface by an inner layer 160 of lower surface encapsulant resin. In addition, the upper surface encapsulant resin layer 156 is covered with a top plate 158, and the lower surface encapsulant resin layer 160 is covered by a backing plate 164. In this embodiment of the present invention, the upper surface encapsulant resin layer 156 has a decorative pigment 166 dispersed therein to simulate the appearance of a conventional roofing shingle.

Figure 12:
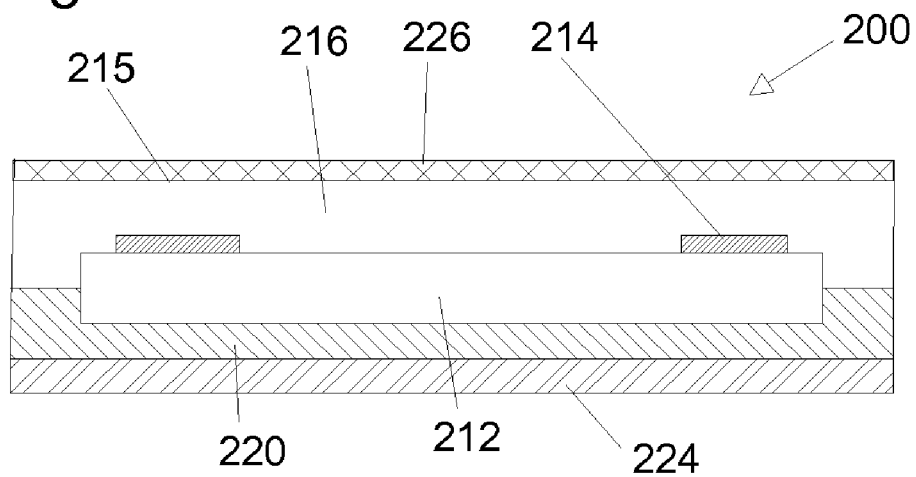
FIG. 12 is a schematic sectional elevational view of an eighth embodiment of a photovoltaic module of the present invention.

FIG. 12 is a schematic, sectional elevational view of another embodiment of the photovoltaic module 200 of the present invention. In this embodiment, the photovoltaic module 200 includes a solar cell stack or photovoltaic element 212 having an upper surface 215. The solar cell stack 212 is fitted with external current collecting electrodes 214 for connecting the photovoltaic element 212 to an external load (not shown). In this embodiment, an encapsulant resin layer 216 covers over the upper surface 215 of the photovoltaic element 212, and a decorative overlay 226 is positioned above the upper surface 215 of the photovoltaic element 212, and in particular in this embodiment, outside the encapsulant resin layer 216. The overlay 226 is substantially transmissive of near infrared radiation and infrared radiation. In the alternative, the decorative overlay can be positioned under the encapsulant resin layer 216 (not shown) or embedded in the encapsulant resin layer 216 (not shown). Further, the solar stack 212 is encapsulated on its lower surface by an inner layer 220 of lower surface encapsulant resin. In addition, the lower surface encapsulant resin layer 220 is covered by a backing layer 224. In this embodiment of the present invention, the decorative overlay 226 simulates the appearance of a conventional roofing tile.

The decorative overlay can be formed using a conventional CMYK printing process. Alternatively, specific inks or coating compositions can be selected for the purpose of better reproducing a chosen image or design. The decorative overlay can be formed using a single ink or colored coating composition, or by two or more inks or colored coating compositions. Preferably, the inks or coating compositions are selected from materials that are substantially infrared transmissive.

In one aspect of the present invention, the decorative overlay is discontinuous and includes a first portion which is free from any coating material ("cutout portion") whatsoever and a second portion including coating material. The cutout portion can maximized consistent with the design objectives of the decorative overlay in order to minimize any possible reduction in the electrical output from the photovoltaic elements associated with the use of the overlay.

In another aspect of the present invention, the decorative overlay includes a first portion which is free from any pigment material ("unpigmented portion") and a second portion including pigment material. The unpigmented portion can similarly be maximized consistent with the design objectives of the decorative overlay in order to minimize any possible reduction in the electrical output from the photovoltaic elements associated with the use of the overlay.

Solar stacks or photovoltaic elements that can be employed in the improved photovoltaic modules of the present invention can include one or more semiconductor photoactive layers of any type known in the art, such as, for example, a semiconductor single crystal silicon layers, non-single crystal semiconductor silicon layers such as amorphous semiconductor silicon layers, microcrystalline semiconductor silicon layers, nanocrystalline semiconductor silicon layers, polycrystalline semiconductor silicon layers, and compound semiconductor layers. The photoactive semiconductor silicon layers can be stacked, and the junctions between the stacked layers can be of the pn-type, the np-type, the Schottky type, etc. The photoactive layers can include n-type silicon layer doped with an electron donor such as phosphorous, oriented towards incident solar radiation, and a p-type silicon layer doped with an electron acceptor, such as boron. The semiconductor stacks can include transparent electrical current conducting layers formed from electrically conductive semiconductor materials such as indium oxide, stannic oxide, zinc oxide, titanium dioxide, cadmium stannate, and the like.

The present invention can also employ thin film type photovoltaic materials, such as multi-junction amorphous silicon solar cells produced on thin, flexible stainless steel substrates and available from United Solar Ovonic LLC, Auburn Hills, Mich., which can be encapsulated in UV-stabilized polymers such as ethylene-vinyl acetate copolymers and fluoropolymers such as Tefzel (ethylene-tetrafluoroethylene) fluoropolymer available from Du Pont de Nemours. Thin film photovoltaic materials employing organic semiconductor materials can also be used.

Resins suitable for use in the present invention for encapsulating semiconductor photovoltaic elements include ethylene vinyl acetate copolymer resins, ethylene ethyl acrylate copolymer resins, ethylene methyl acrylate copolymer resins, polyvinyl butyral resins, polyurethane resins, fluororesins, and silicone resins. Resins that are substantially transparent or at least transmissive to near infrared radiation and to infrared radiation, such as ethylene vinyl acetate resins, are preferred. The resins can be employed in the form thermoplastic or thermosetting fluids applied to a substrate including the photovoltaic materials, as films applied to the photovoltaic materials, or the like.

The physical properties of encapsulant resins for use in the preparing the photovoltaic modules of the present invention can be adjusted by selecting resins having suitable average molecular weight, suitable molecular weight distributions, suitable degrees of branching, and suitable levels of crosslinking. Preferably, the physical properties of the encapsulant resin are chosen to provide suitable impact resistance, low temperature resistance, high temperature resistance, environmental stability, and adhesion for use in encapsulating semiconductor photovoltaic elements in photovoltaic modules for exterior use.

The encapsulant resins used in preparing the photovoltaic modules of the present invention can include suitable amounts, preferably from about 0.1 to 1.0 percent by weight of the encapsulant resin, of additives to enhance the ultraviolet radiation resistance and/or the radiation stabilization of the encapsulant resin. For example, ultraviolet radiation absorbers such as benzophenones, benzotriazoles, cyanoacrylates, and salicylic acid derivatives can be employed, including 2-hydroxy-4-methoxybenzophenone, 2-hydroxy-4-n-octyloxybenzophenone, 2-(2-hydroxy-5-t-octylpheyl)benzotriazole, titanium dioxide, cerium (IV) oxide, zinc oxide and stannic oxide. Preferred ultraviolet radiation absorbers include nanoparticle zinc oxides and titanium dioxides. Suitable radiation stabilizers, which are to be used in conjunction with ultraviolet radiation absorbents, include hindered amine bases such as, for example, derivatives of 2,2,6,6-tetramethyl piperidine of lower molecular weight or in polymeric form. The encapsulant resins can also include anti-oxidants such as hindered phenols, and adhesion-promoting agents such as organic titanates.

The optional top plate or cover member used for preparing the photovoltaic modules of the present invention is preferably formed from a material which is substantially transparent to near infrared radiation and infrared radiation, and has good mechanical strength. Suitable materials include tempered glass sheets having high transparency to near infrared and infrared radiation, and synthetic polymer sheets and films such as fluororesin sheets and films, and acrylic sheets and films. Suitable fluororesins include polyvinylidene fluoride resins and tetrafluoroethylene-ethylene copolymers. When a synthetic polymer film is employed as a cover member, the cover member preferably has a thickness of from about 10 to 100 micrometers.

In some embodiments of the photovoltaic module of the present invention, the encapsulant resin can include a visible light absorbing colorant, such as a dye or pigment. Preferably, when such a visible light absorbing colorant is included in the encapsulant resin, the colorant is selected to have high transmissivity to near infrared radiation and infrared radiation.

In the photovoltaic module of the present invention, the lower surface encapsulant resin may be the same resin as employed as the upper surface encapsulant resin. However, the lower surface encapsulant resin can also differ from the resin used as upper surface encapsulant resin, in that the service requirements differ for these two resin layers. In particular, the lower surface encapsulant resin need not be transmissive to near infrared radiation and infrared radiation. Thus, in addition to the resin materials that can be employed for forming the upper surface encapsulant resin layer, other resin materials, such as epoxy resins, can be used to form the lower surface encapsulant resin layer.

The backing plate employed in preparing the photovoltaic modules of the present invention is preferably formed from a rigid material, such as aluminum, steel, or a reinforced composite material, and more preferably a rigid electrically insulating material having low electrical conductivity, such as a nylon, a polytetrafluoroethylene material, polycarbonate, polyethylene, polystyrene, polyester, or the like. However, more flexible, less rigid materials may also be employed.

Preferably, in the photovoltaic modules of the present invention a color layer is selected such that that, despite its pigmentation, it does not prevent the passage of the wavelengths within the solar spectrum that are largely responsible for the photovoltaic activity.

The present invention also provides a method of producing a photovoltaic module having controllable and desirable aesthetics for use in roof applications while still maintaining sufficient efficiency in power generation. In the process of the present invention an overlay film or coating having a desirable visual appearance in the visible range of the spectrum, and substantially transmissive of near infrared and infrared radiation is applied to or incorporated in a photovoltaic device. The photovoltaic device is capable of producing electricity because near infrared and infrared radiation passing through the overlay film or coating activate the photovoltaic device.

In one embodiment, the coating or film is transmissive or transparent in the near infrared range and scatters, reflects or absorbs light in the visible range of the spectrum to produce a desired appearance. Infrared-transmissive pigments can be used to provide visible color to the coating or film. Suitable infrared-transmissive pigments can be inorganic or organic. In the case of organic pigments, it is preferred to include a protective overlay film that contains an ultraviolet absorber. The ultraviolet absorber provides an element of weatherability enhancement for organic transparent pigments. Examples of infrared-transmissive pigments that can be employed in the photovoltaic modules of the present invention include zinc sulfide, zinc oxide, nanoparticle titanium dioxide and other nanopigments, CI Pigment Black 31, CI Pigment Black 32, CI Pigment Red 122, CI Pigment Yellow 13, perylene pigments, ultramarine blue pigments, quinacrodone pigments, azo pigments, and pealescent pigments.

Preferred polymers for such films include acrylics, polycarbonates and fluoropolymers such as fluororesins. Ultraviolet radiation resistant polymers such as acrylic polymers and fluoropolymers are especially preferred.

In one embodiment, a continuous coating or film is provided over the entire surface of the photovoltaic module. In another embodiment, the coating or film is discontinuous. Such discontinuous coatings can be applied by printing techniques. Coloration to produce the desired appearance can be accomplished by a three or four color halftone printing process where different portions or dots are printed with different colors to provide an overall visual effect when viewed from a distance. In some instances, monochromatic prints can also be employed where the base background color of the photovoltaic module itself also contributes to the overall color and appearance of the modified module of the invention.

In the case of a discontinuous coating, some of the printed areas can optionally be opaque even to near infrared or infrared radiation provided a sufficient area of the photovoltaic surface is available to capture light to activate the device. Such opacity in selected portions of the surface can be used to expand the range of accessible aesthetic effects for the photovoltaic module in a roofing application.

The use of infrared-transmissive pigments to modify the surface of photovoltaic modules greatly improves the ability to harmonize such modules in an aesthetically pleasant fashion with the rest of the roofing cover while, also eliminating the narrow color selection issue posed by the products currently available.

EXAMPLE

A photovoltaic cell was connected to a Simpson 260 volt meter and exposed to sky light on a sunny day with an ambient temperature of 24 C. The voltage reading for the output of the photovoltaic cell was 8.3 V. The visual appearance of the photovoltaic cell was unchanged from its natural condition.

A sheet of infrared long pass film having a high transmissivity in the near infrared region of the spectrum and strong absorbance in the visible spectrum was placed over the exposed surface of the photovoltaic cell. The voltage reading for the output of the photovoltaic cell was 7.8 V. The photovoltaic cell was completely obscured by the infrared long pass film and the surface had a black appearance. The electrical output of the photovoltaic cell remained at 94% of its natural level without the infrared-transmissive overlay.

Various modifications can be made in the details of the various embodiments of the processes and articles of the present invention, all within the scope and spirit of the invention and defined by the appended claims.

The invention claimed is:

1. A photovoltaic module comprising a photovoltaic element having an upper surface, an encapsulant resin layer over the upper surface of the photovoltaic element, and a decorative overlay positioned above the upper surface of the photovoltaic element, the overlay being substantially transmissive of near infrared radiation and infrared radiation wherein the decorative overlay is embedded in the encapsulant resin layer.

2. A photovoltaic module according to claim 1 wherein the decorative overlay simulates the appearance of a conventional roofing shingle surface.

3. A photovoltaic module according to claim 1 wherein the decorative overlay comprises a coating layer including a binder and at least one infrared-transmissive pigment.

4. A photovoltaic module according to claim 3 wherein the at least one infrared-transmissive pigment is selected from the group consisting of zinc sulfide, zinc oxide, nanoparticle titanium dioxide, CI Pigment Black 31, CI Pigment Black 32, CI Pigment Red 122, and CI Pigment Yellow 13.

5. A photovoltaic module according to claim 1 wherein the overlay comprises a film material.

6. A photovoltaic material according to claim 5 wherein the film material includes a carrier and at least one infrared-transmissive pigment.

7. A photovoltaic module according to claim 5 wherein the film material includes a decorative layer on the surface of the film.

8. A photovoltaic module according to claim 7 wherein the decorative layer is formed by a halftone printing process.

9. A photovoltaic module comprising a photovoltaic element having an upper surface, an encapsulant resin layer over the upper surface of the photovoltaic element, and a decorative overlay positioned above the upper surface of the photovoltaic element, the overlay being substantially transmissive of near infrared radiation and infrared radiation wherein the decorative overlay is positioned under the encapsulant resin layer, the decorative overlay comprising a coating layer including a binder and at least one infrared-transmissive pigment.

10. A photovoltaic module according to claim 9 wherein the at least one infrared-transmissive pigment is selected from the group consisting of zinc sulfide, zinc oxide, nanoparticle titanium dioxide, CI Pigment Black 31, CI Pigment Black 32, CI Pigment Red 122, and CI Pigment Yellow 13.

11. A photovoltaic module comprising a photovoltaic element having an upper surface, an encapsulant resin layer over the upper surface of the photovoltaic element, and a decorative overlay positioned above the upper surface of the photovoltaic element, the overlay being substantially transmissive of near infrared radiation and infrared radiation wherein the decorative overlay is positioned under the encapsulant resin layer, the overlay comprising a film material, the film material including a carrier and at least one infrared-transmissive pigment.

12. A process for producing a decorative photovoltaic module comprising:
(a) providing a photovoltaic module including a semiconductor stack encapsulated in an infrared transmissive resin having an upper resin layer, and
(b) printing a decorative pattern on the upper resin layer using an ink selected from the group consisting of opaque inks, infrared transmissive inks and partially transmissive inks.

13. The process of claim 12, wherein the decorative photovoltaic module is incorporated into a roofing cover.

14. The process of claim 12, wherein the decorative pattern includes an infrared transmissive ink on at least a first portion of the upper resin layer and an opaque ink on at least a second portion of the upper resin layer.

15. The process of claim 14, wherein the infrared-transmissive ink includes at least one infrared-transmissive pigment selected from the group consisting of zinc sulfide, zinc oxide, nanoparticle titanium dioxide, CI Pigment Black 31, CI Pigment Black 32, CI Pigment Red 122, and CI Pigment Yellow 13.

* * * * *